United States Patent
Lee et al.

(10) Patent No.: US 10,381,293 B2
(45) Date of Patent: Aug. 13, 2019

(54) INTEGRATED CIRCUIT PACKAGE HAVING AN IC DIE BETWEEN TOP AND BOTTOM LEADFRAMES

(71) Applicant: Texas Instruments Incorporated, Dallas, TX (US)

(72) Inventors: Lee Han Meng@Eugene Lee, Johor (MY); Chong Han Lim, Selangor (MY); You Chye How, Melaka (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 86 days.

(21) Appl. No.: 15/003,238

(22) Filed: Jan. 21, 2016

(65) Prior Publication Data

US 2017/0213781 A1 Jul. 27, 2017

(51) Int. Cl.
*H01L 21/48* (2006.01)
*H01L 23/00* (2006.01)
*H01L 23/495* (2006.01)

(52) U.S. Cl.
CPC .... *H01L 23/49537* (2013.01); *H01L 21/4828* (2013.01); *H01L 23/49541* (2013.01); *H01L 23/49568* (2013.01); *H01L 23/49575* (2013.01); *H01L 23/49582* (2013.01); *H01L 23/49589* (2013.01); *H01L 21/4825* (2013.01); *H01L 21/4839* (2013.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01); *H01L 24/92* (2013.01); *H01L 2224/16245* (2013.01); *H01L 2224/291* (2013.01); *H01L 2224/32245* (2013.01); *H01L 2224/73253* (2013.01); *H01L 2224/81815* (2013.01); *H01L 2224/83192* (2013.01); *H01L 2224/92225* (2013.01); *H01L 2224/97* (2013.01); *H01L 2924/15153* (2013.01)

(58) Field of Classification Search
CPC ....... H01L 23/494; H01L 23/31; H01L 23/00; H01L 24/97; H01L 23/49537; H01L 23/49568; H01L 23/49575; H01L 23/49589; H01L 21/4828; H01L 23/49541; H01L 23/49582; H01L 21/4825; H01L 21/4839; H01L 24/16; H01L 24/29; H01L 24/32; H01L 24/73; H01L 24/81; H01L 24/83; H01L 24/92; H01L 2224/16245; H01L 2224/291; H01L 2224/32245; H01L 2224/81815; H01L 2224/83192; H01L 2224/92225; H01L 2924/15153; H01L 2224/81; H01L 2224/014; H01L 2924/00014; H01L 21/21; H01L 23/495
USPC ........ 257/666, 676, 724, 723, 686, 685, 777
See application file for complete search history.

(56) References Cited

U.S. PATENT DOCUMENTS 5,767,570 A * 6/1998 Rostoker ........... H01L 23/49811
257/668
6,492,726 B1 * 12/2002 Quek .................... H01L 23/055
257/723

(Continued)

*Primary Examiner* — Alexander O Williams
(74) *Attorney, Agent, or Firm* — Ronald O. Neerings; Charles A. Brill; Frank D. Cimino

(57) ABSTRACT

An integrated circuit (IC) package includes a first leadframe having a top surface and a bottom surface. An IC die has an active side coupled to the first leadframe bottom surface and has a back side. A second leadframe has a top surface and a bottom surface. The back side of said IC chip is coupled to the top surface of the second leadframe.

19 Claims, 15 Drawing Sheets

(56) References Cited

U.S. PATENT DOCUMENTS

| | | | | |
|---|---|---|---|---|
| 7,321,160 B2* | 1/2008 | Hinkle | H01L 23/49503 | 257/666 |
| 7,598,603 B2* | 10/2009 | Otremba | H01L 23/4334 | 257/666 |
| 7,842,555 B2* | 11/2010 | Joshi | H01L 23/49562 | 257/E21.51 |
| 8,779,566 B2* | 7/2014 | Lee | H01L 23/495 | 257/668 |
| 9,029,990 B2* | 5/2015 | Lee | H01L 23/49568 | 257/666 |
| 9,478,484 B2* | 10/2016 | Otremba | H01L 23/49524 | |
| 2008/0067641 A1* | 3/2008 | Jow | H01L 21/565 | 257/666 |
| 2008/0303125 A1* | 12/2008 | Chen | H01L 23/495 | 257/676 |
| 2009/0160595 A1* | 6/2009 | Feng | H01F 17/0033 | 336/200 |
| 2010/0091472 A1* | 4/2010 | Kummerl | H01L 23/49541 | 361/772 |
| 2010/0109147 A1* | 5/2010 | Autry | H01L 23/4334 | 257/692 |
| 2010/0148328 A1* | 6/2010 | Son | H01L 21/565 | 257/675 |
| 2010/0164078 A1* | 7/2010 | Madrid | H01L 23/3107 | 257/675 |
| 2010/0176508 A1* | 7/2010 | Herbsommer | H01L 23/4334 | 257/718 |
| 2010/0232131 A1* | 9/2010 | Qian | H01L 23/49524 | 361/813 |
| 2010/0314743 A1* | 12/2010 | Li | H01L 23/4334 | 257/690 |
| 2011/0089546 A1* | 4/2011 | Bayan | H01L 21/6835 | 257/676 |
| 2012/0001308 A1* | 1/2012 | Fukutani | H01L 23/49524 | 257/675 |
| 2012/0038033 A1* | 2/2012 | Oga | H01L 21/565 | 257/659 |
| 2012/0313229 A1* | 12/2012 | Lee | H01L 23/3107 | 257/675 |
| 2013/0045572 A1* | 2/2013 | Lee | H01L 23/495 | 438/122 |
| 2013/0126916 A1* | 5/2013 | Arai | H01L 27/15 | 257/88 |
| 2014/0191381 A1* | 7/2014 | Lee | H01L 23/495 | 257/676 |
| 2015/0060123 A1* | 3/2015 | Eugene Lee | H01L 23/49537 | 174/261 |
| 2015/0177043 A1* | 6/2015 | Tokuyasu | G01F 1/692 | 73/202.5 |
| 2016/0233150 A1* | 8/2016 | Fukui | H01L 23/49562 | |
| 2017/0133355 A1* | 5/2017 | Chen | H01L 25/162 | |
| 2017/0345790 A1* | 11/2017 | Eugene Lee | H01L 23/49537 | |

* cited by examiner

INTEGRATED CIRCUIT PACKAGE HAVING AN IC DIE BETWEEN TOP AND BOTTOM LEADFRAMES

BACKGROUND

Modern semiconductor packaging technology, to be commercially competitive, must meet a growing number of customer requirements, such as a small package size form factor, good thermal performance, and flexible trace routing, that also provides good signal integrity.

SUMMARY

An integrated circuit (IC) package includes a first leadframe having a top surface and a bottom surface. The package includes an IC die that has an active side coupled to the first leadframe bottom surface. The package also includes a second leadframe. The back side of the IC die is coupled to the top surface of the second leadframe.

A method of making an integrated circuit ("IC") package includes providing a leadframe strip having a plurality of leadframes with a first leadframe having inner lead portions and peripheral lead portions. The method also includes mounting at least one passive device on the first leadframe. The method further includes encapsulating the first leadframe strip, including the passive device(s) and portions of the first leadframe, in mold compound with parts of the first leadframe interior lead portions and parts of the first leadframe peripheral lead portions exposed. The method also includes coupling an active side of an IC die to the interior lead portions of the first leadframe to form a first die-mounted encapsulated leadframe assembly.

A method of making an integrated circuit ("IC") package includes encapsulating a first leadframe having passive devices mounted thereon. The method also includes coupling an IC die to exposed portions of the first leadframe.

A method of making an integrated circuit package includes providing an upper and lower leadframe and an IC die and sandwiching the integrated circuit die between the upper and lower leadframes.

Some embodiments of the IC package disclosed herein may have some or all of the following advantages. The package may include passive components and still maintain a small package size form factor. The package configuration enables the back of an attached IC die to be attached to a bottom heat sink, which enables heat to efficiently travel out of the package so as to provide excellent thermal performance. The package includes a one piece bottom heat sink that enables easy mounting of the package on a printed circuit board ("PCB"). The attached die may be a "flip chip" that provides good signal integrity and product performance. The package employs a quad flat no-lead package (QFN) leadframe that provides good signal routing.

DETAILED DESCRIPTION

Figure 1:
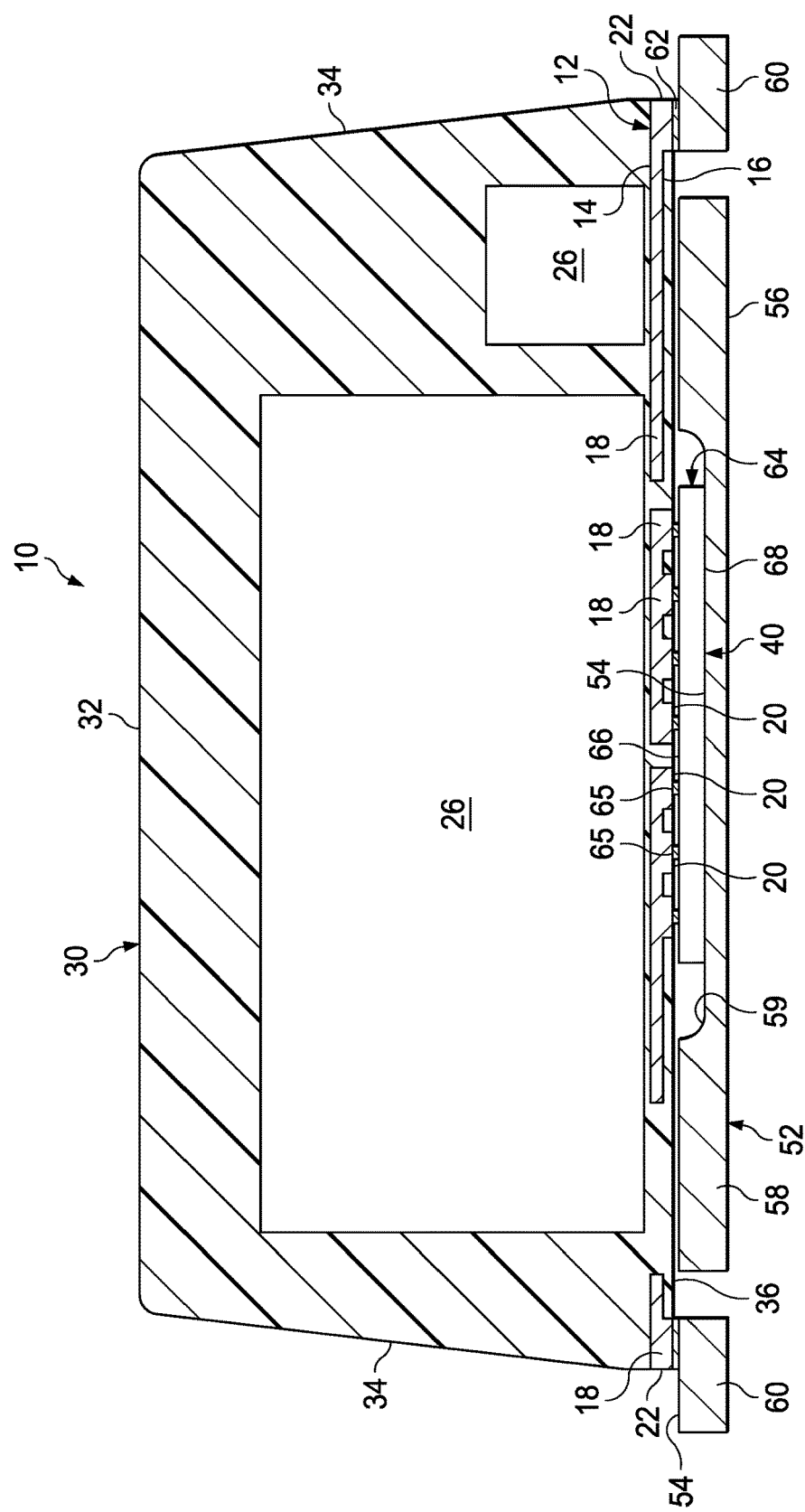
FIG. 1 is a cross-sectional elevation view of an integrated circuit (IC) package.

FIG. 1 is a cross-sectional elevation view of an integrated circuit (IC) package 10, which includes a first leadframe 12 having a top surface 14 and a bottom surface 16. The first (top) leadframe 12 comprises a plurality of leads 18 and a plurality of device attached pads 24. Passive devices 26, such as capacitors and inductors, are mounted on the device attach pads 24, as with solder. The plurality of leads 18 comprise a plurality of inner termination points 20 and peripheral termination points 22.

The passive devices 26 and the first leadframe 12, except for certain bottom surface portions of the leads 18, are covered in a block of mold compound 30, which may be plastic. The block of mold compound 30 may have a generally trapezoid shaped cross-section and may includes a top surface 32, four lateral side surfaces 34, and a bottom surface 36. An assembly including the first leadframe 12, the passive devices 26, and the block of mold compound 30 is sometimes referred to herein as "the molded leadframe assembly 50."

A second (bottom) leadframe 52 has a top surface 54 and a bottom surface 56. The second leadframe 52 comprises a heat sink 58 and a plurality of peripheral leads 60, positioned on opposite sides of the heat sink 58.

An integrated circuit die 64 has an active surface 66 and an opposite back/inactive surface 68. The back surface 68 of the integrated circuit die 64 is attached, as by solder, to a die attached pad 59, which is provided by a recess in the heat sink 58.

Having thus described the integrated circuit package 10, the method by which the package 10 is produced and various components thereof will now be described in further detail.

Figure 2:
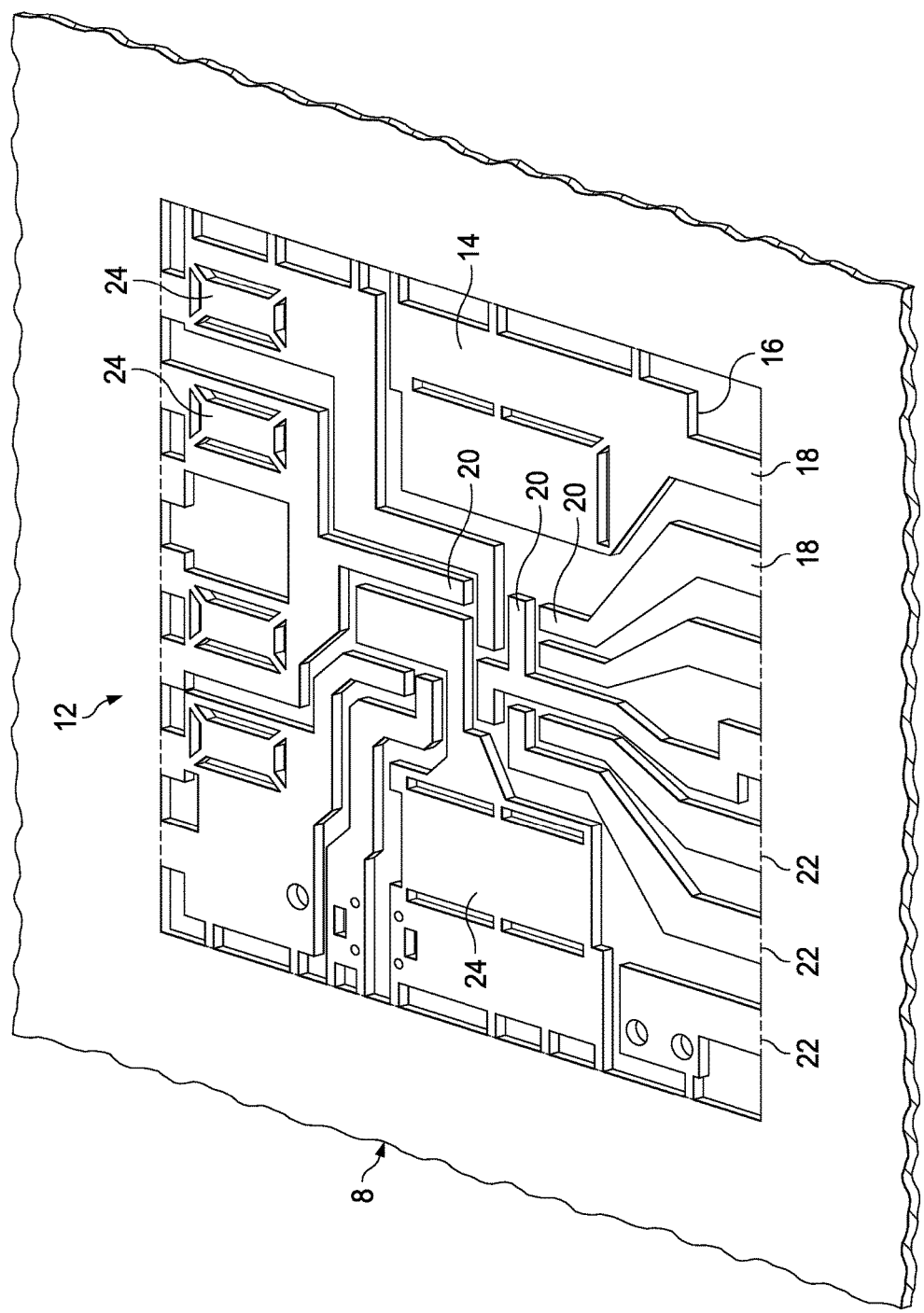
FIG. 2 is a top isometric view of a first (top) leadframe.

The process of making the integrated circuit package 10 starts with FIG. 2, which is a top isometric view of the first leadframe 12. FIG. 2 shows in detail the inner termination points 20 and peripheral termination points 22 of the plurality of leads 18, and also shows in detail the device attached pads 24. Although a single first leadframe 12 is illustrated in FIG. 2, it is to be understood that the single leadframe 12 is, in one embodiment, part of a larger leadframe strip 8 that comprises multiple integrally connected leadframes. Other leadframe portions of the leadframe strip 8 are shown schematically as empty space in FIG. 2, and are not shown at all in FIGS. 3-8 to avoid unnecessary clutter in the drawings. However, it is to be understood that the other leadframe portions of the strip 8 are identical to the leadframe 12. The identical leadframes 12 remain integrally connected in strip form through the operations shown in FIG. 8. The leadframe strip 8 is, at this point, singulated into multiple, packaged leadframe portions, as further described below. Providing leadframes in strip form and subsequent singulation thereof after certain identical packaging operations have been performed on each leadframe in the strip is conventional and known in the art.

Figure 3:
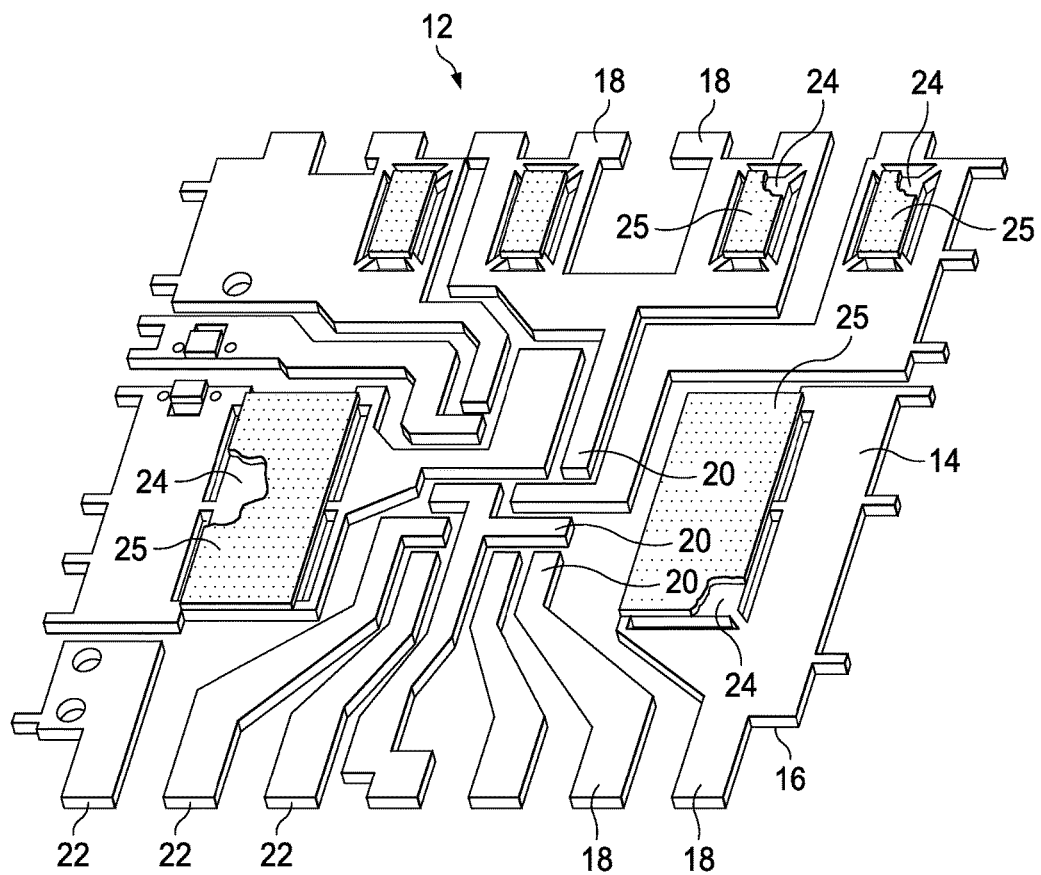
FIG. 3 is a top isometric view of the leadframe of FIG. 1 with solder paste printed thereon.

FIG. 3 is a top isometric view of the leadframe of FIG. 2 and shows that, as a next step of the process, solder paste 25 is applied to the leadframe 12 attach pads 24 as by screen printing or inkjet printing. This process shown in FIG. 3 is applied to all of the leadframes in the leadframe strip 8. This is true of all of the processes shown in FIGS. 3-8.

Figure 4:
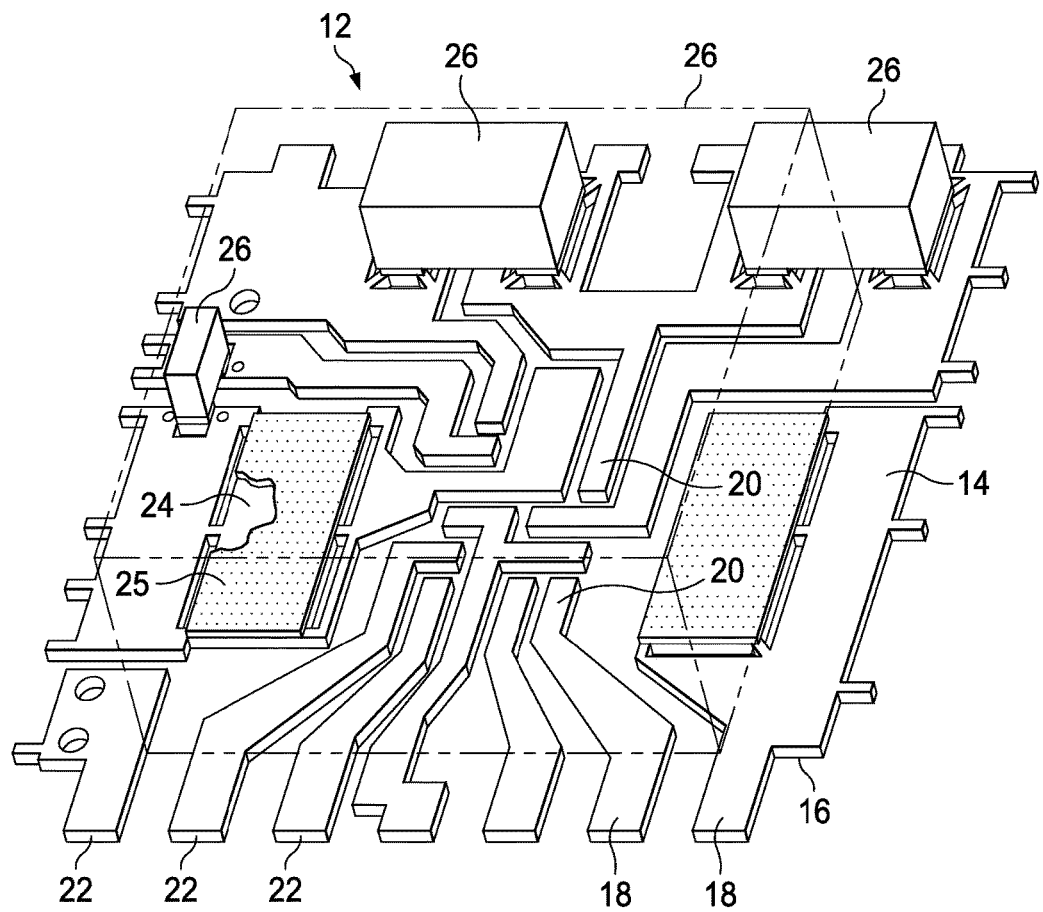
FIG. 4 is a top isometric view of the leadframe of FIGS. 1 and 2 with passive devices mounted thereon.

FIG. 4 is a top isometric view of the first leadframe 12. It shows that in the next process step passive devices 26 are mounted on the solder paste printed regions of pads 24 and subsequently permanently attached to the first leadframe 12 by solder reflow. The largest of the three passive devices 26 has been illustrated in dashed lines to avoid obscuring other details of the assembly.

Figure 5:
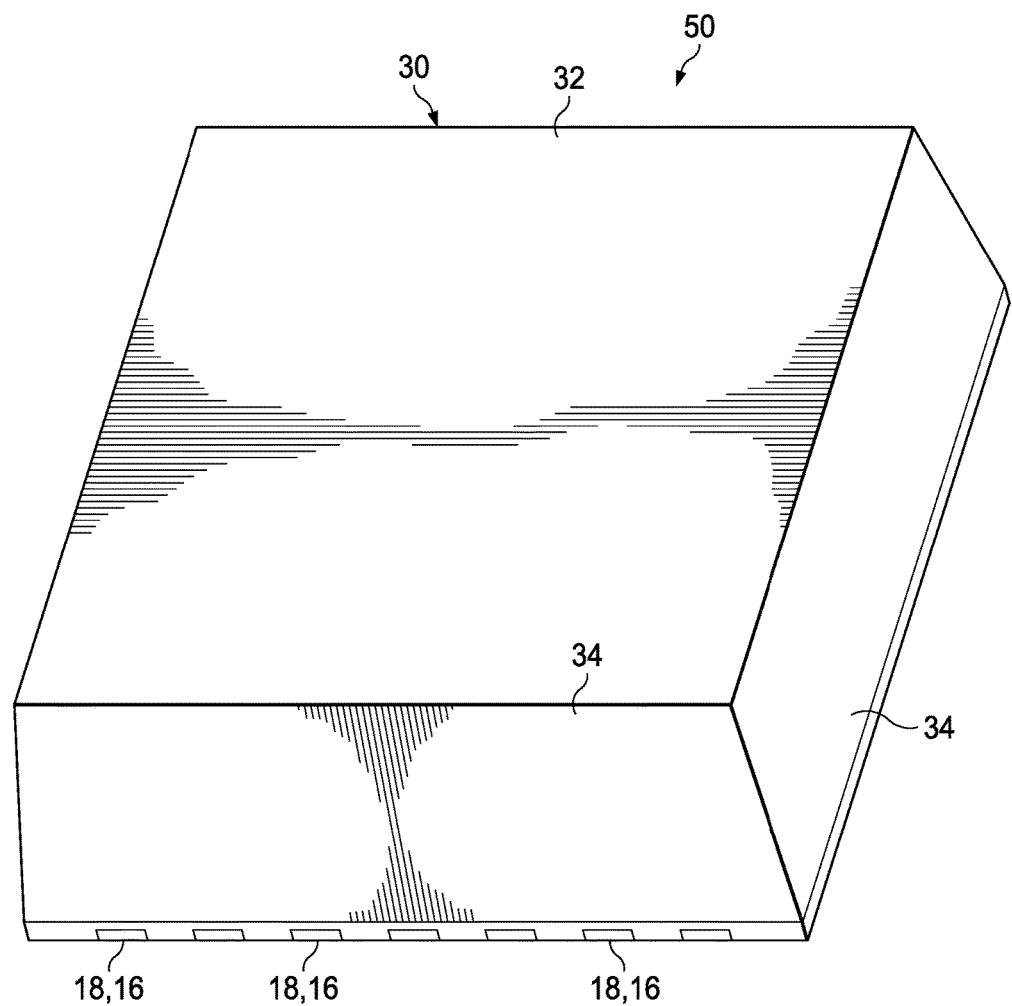
FIG. 5 is a top isometric view of the passive device-mounted leadframe of FIG. 4 after molding.
Figure 6:
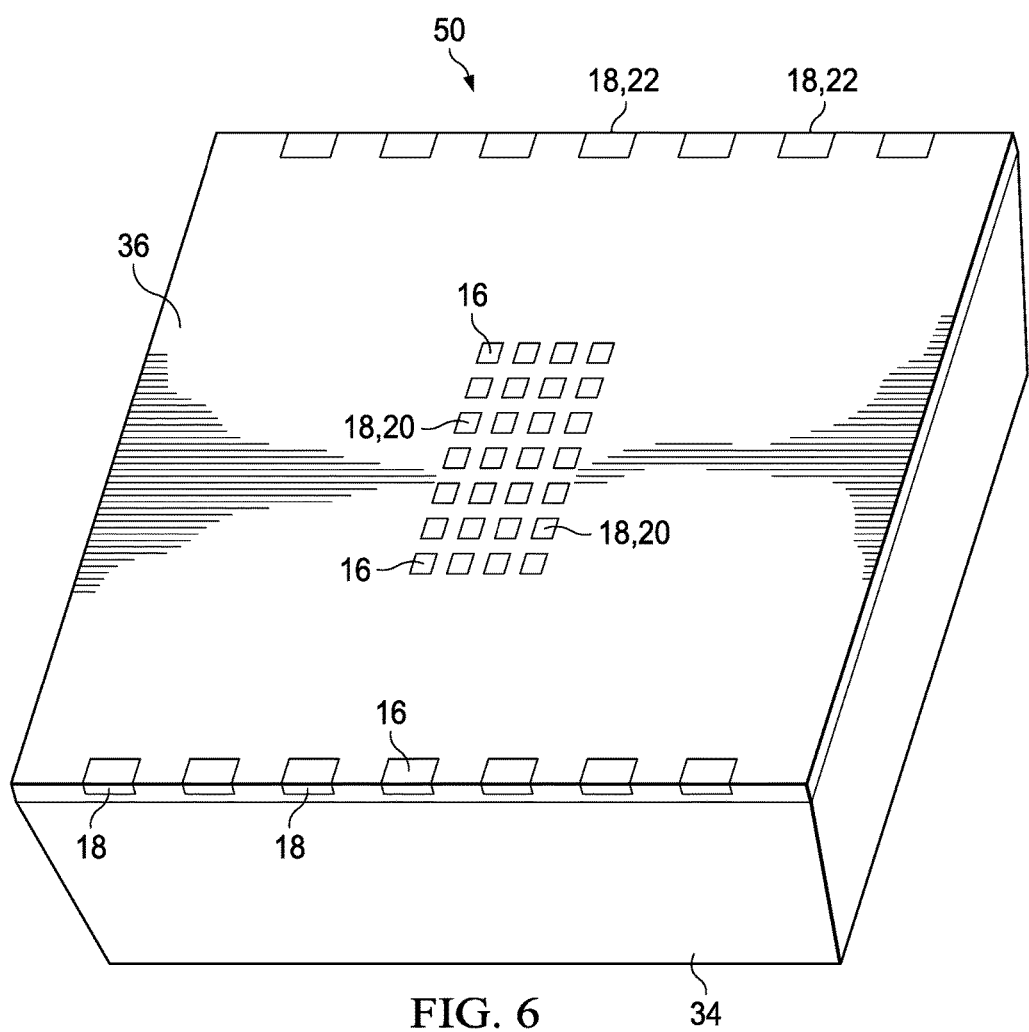
FIG. 6 is a bottom isometric view of the molded leadframe of FIG. 5.

The next step in the process is molding, as by conventional molding processes, of the assembly of FIG. 4, FIG. 5 and 6 are top and bottom isometric views of the passive device-mounted leadframe of FIG. 4 after molding. Molding provides the molded leadframe assembly 50. In this assembly 50 the inner lead termination regions 16 and the peripheral lead termination regions 16 are exposed at the bottom surface 36 of the mold compound block 30. The peripheral lead termination regions 16 are also exposed at side portions of the assembly 50, as shown.

Figure 7:
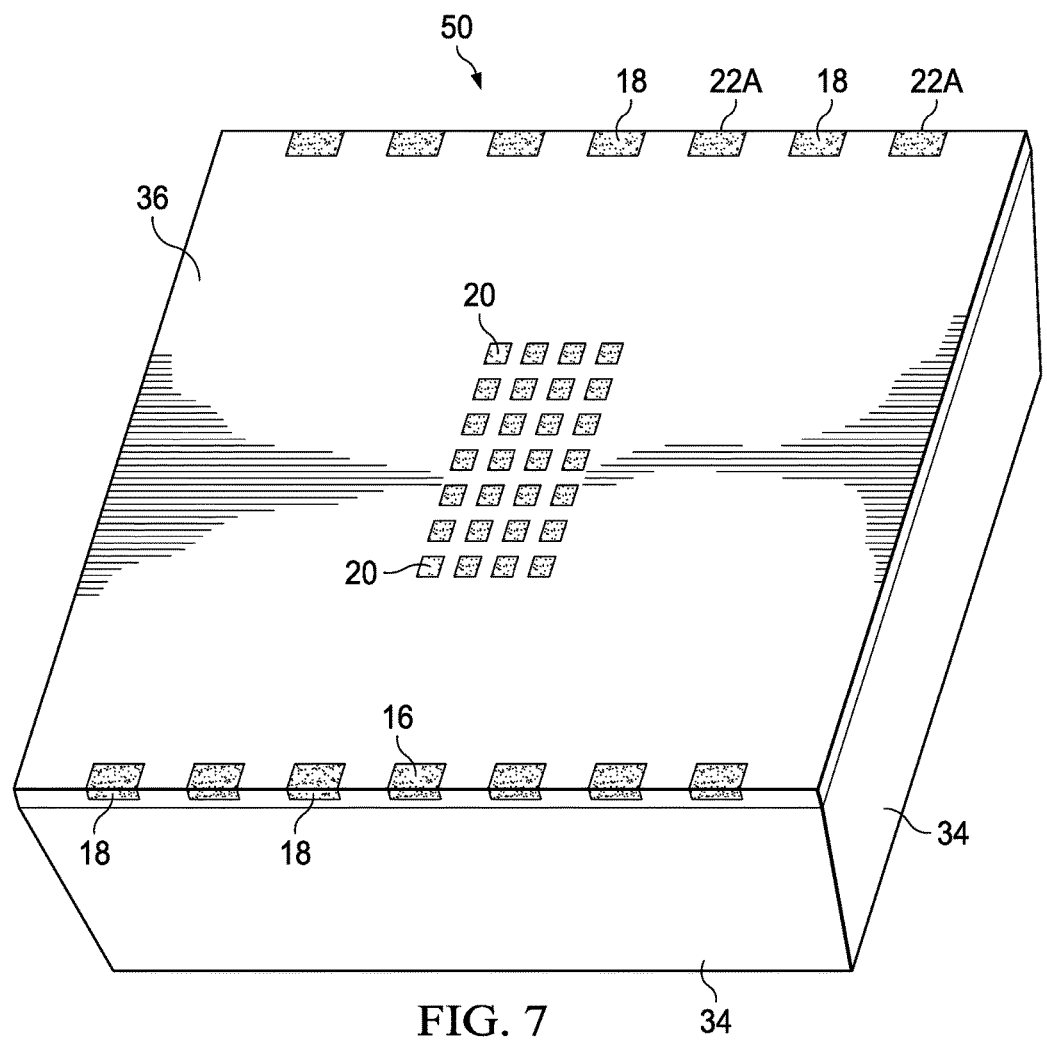
FIG. 7 is a bottom isometric view of the molded leadframe of FIG. 6 after plating.

Next, the exposed lead regions 16 and 20 are metal plated by conventional plating methods. FIG. 7 is a bottom isometric view of the molded leadframe of FIG. 6 after the plating operation.

Figure 8:
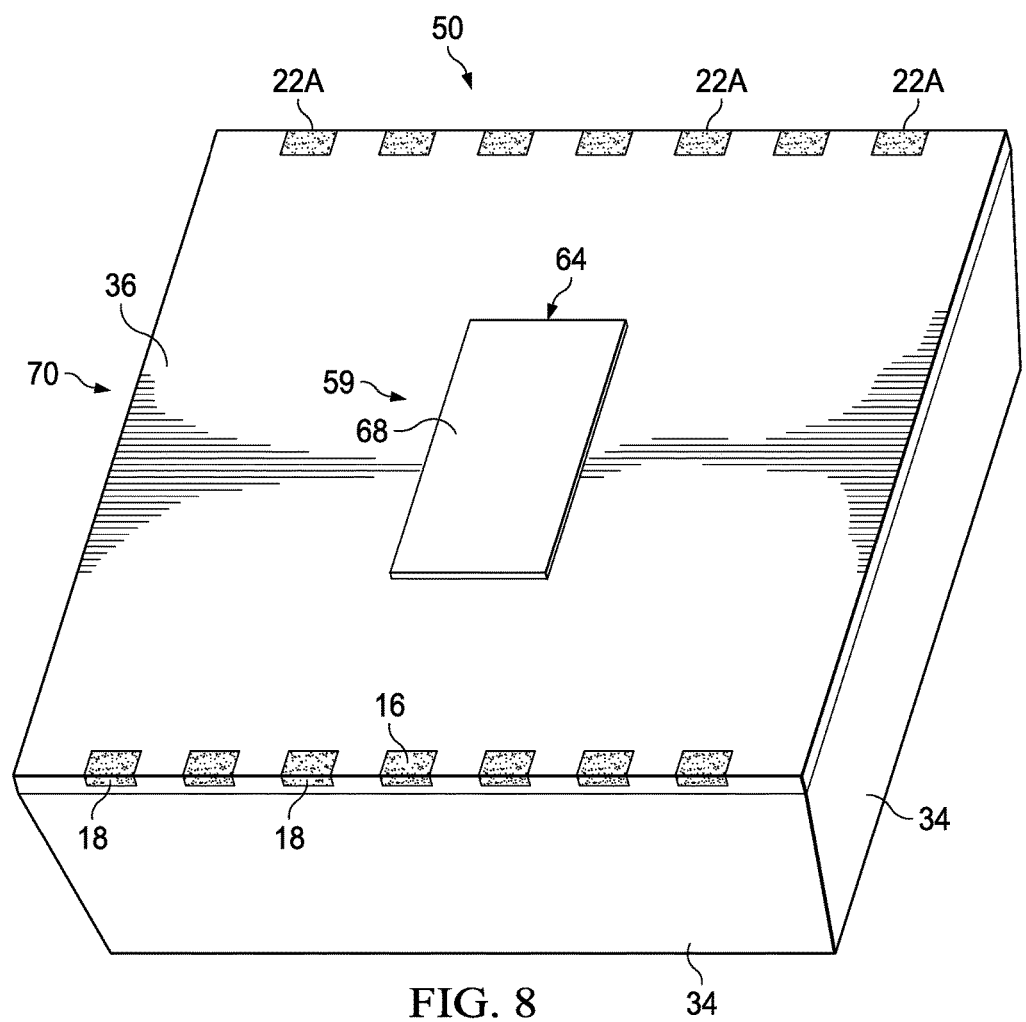
FIG. 8 is a bottom isometric view of the molded leadframe of FIG. 7 after mounting of an IC die thereon.

In the next step, as shown in FIG. 8, an integrated circuit die 64 has contact regions 65, FIG. 1, on the active side 66 thereof coupled to the exposed, plated, inner lead termination regions 20, FIG. 7, of the first leadframe 12. The assembly shown in FIG. 8 is a bottom isometric view of the molded leadframe of FIG. 7, after mounting of the IC die 64 thereon. (The molded leadframe assembly 50 with the die 64 mounted thereon will be referred to herein as the "die-mounted molded leadframe assembly 70.") The backside 68 of the die 64 is exposed. In the illustrated embodiment, the IC die 64 is a flip chip, but other types of IC dies may also be used. After mounting of a die 64 on each assembly 50, the die-mounted molded leadframe assembly 70 is reflowed to permanently attach the die 64.

The processes described above are performed on the leadframe 12 while it is integrally connected to other leadframes in the leadframe strip 8. After reflow, the leadframe strip 8 is singulated into the multiple reflowed assemblies, such as reflowed assembly 70 shown in FIG. 8.

Figure 9:
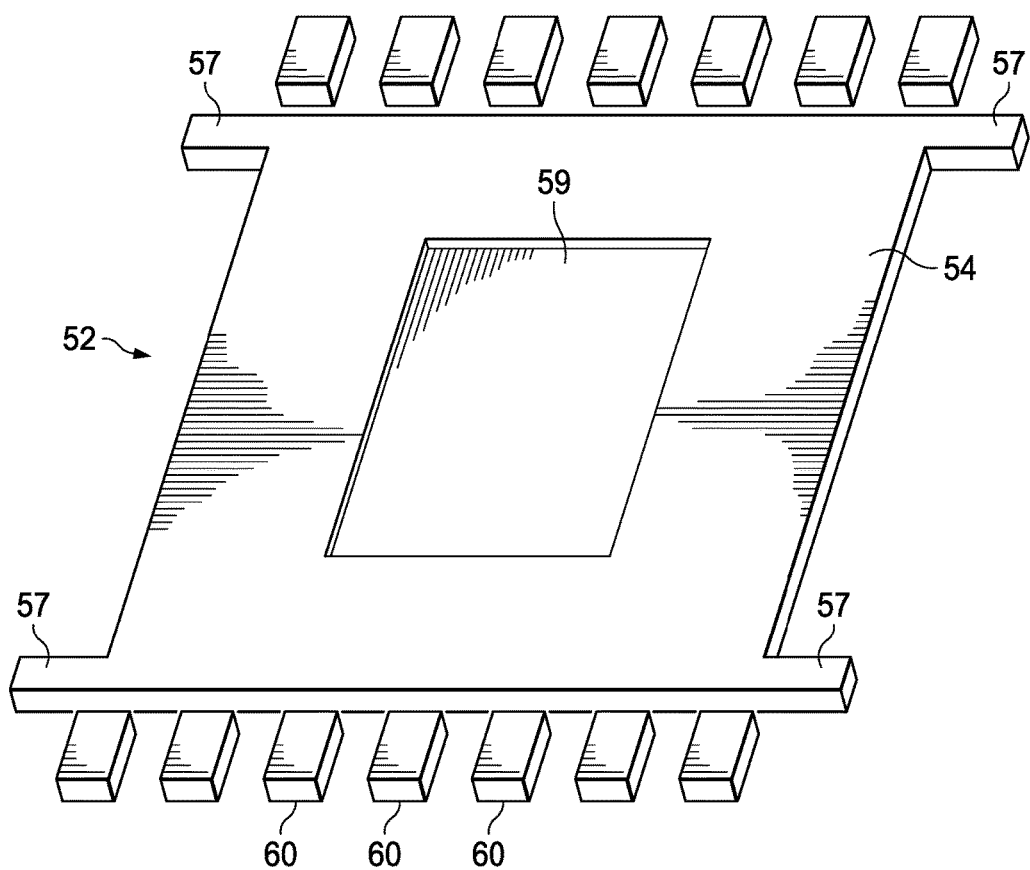
FIG. 9 is a top isometric view of a second (bottom) leadframe.

FIG. 9 is a top isometric view of the second or "bottom" leadframe 52 prior to mounting of the assembly 70 of FIG. 8 thereon. The second leadframe 52 includes a heat sink 58 and a plurality of peripheral leads 60 positioned on two opposite sides of the heat sink. FIG. 9 also illustrates that the second leadframe heat sink 58 has a recessed die attachment pad 59 formed therein that is adapted to receive the integrated circuit die 64. This recessed die attachment pad 59 may be provided as by half etching the heat sink 52. FIG. 9 also illustrates that the heat sink 58 may comprises four bar extensions 57 that facilitate centering the second leadframe 52 relative to the bottom surface 36 of the die-mounted molded leadframe assembly 70.

Figure 10:
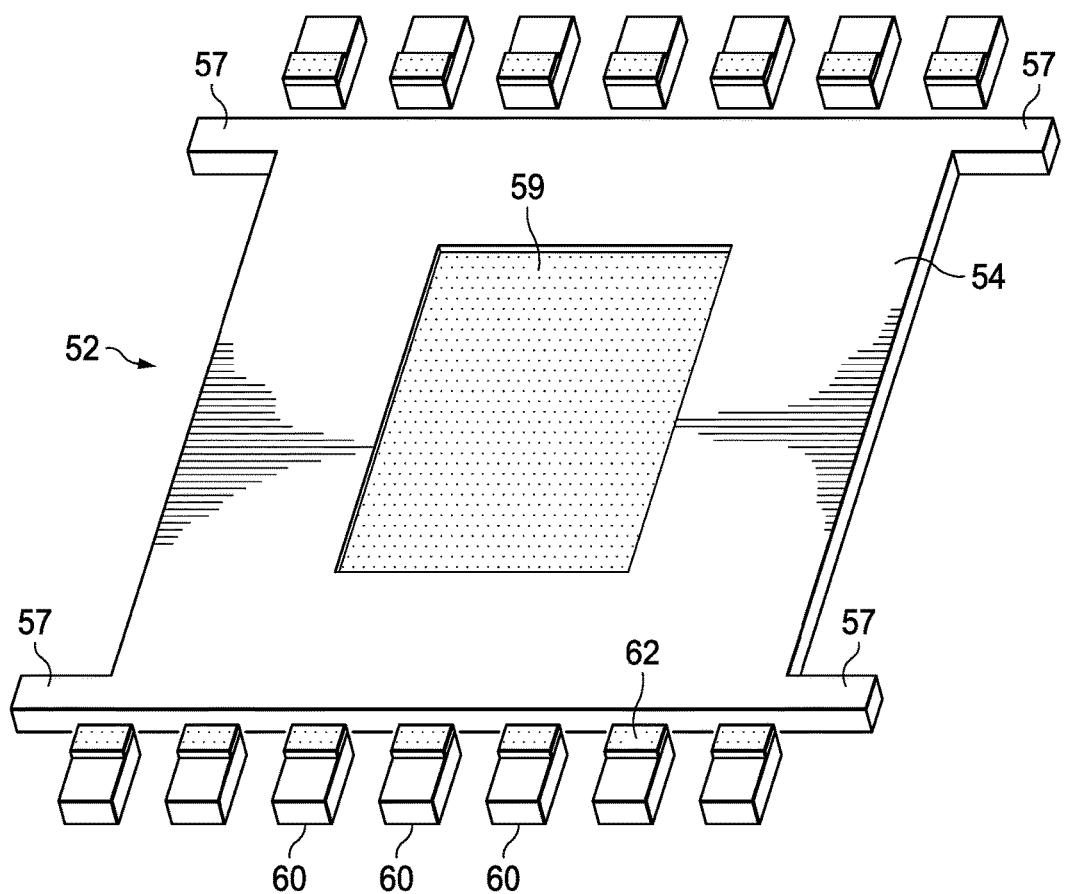
FIG. 10 is a top isometric view of the second leadframe a FIG. 9 after printing of attachment material thereon.

FIG. 10 illustrates that attachment medium, such as solder paste 62, may be printed on the upper surfaces of leads 60 to facilitate attachment of the leads 60 of the second leadframe 52 to the bottom surfaces of peripheral leads 22 of the first leadframe 12 in assembly 70. Solder paste 62 may also be printed on the top surface of the recessed die attach pad.

Figure 11:
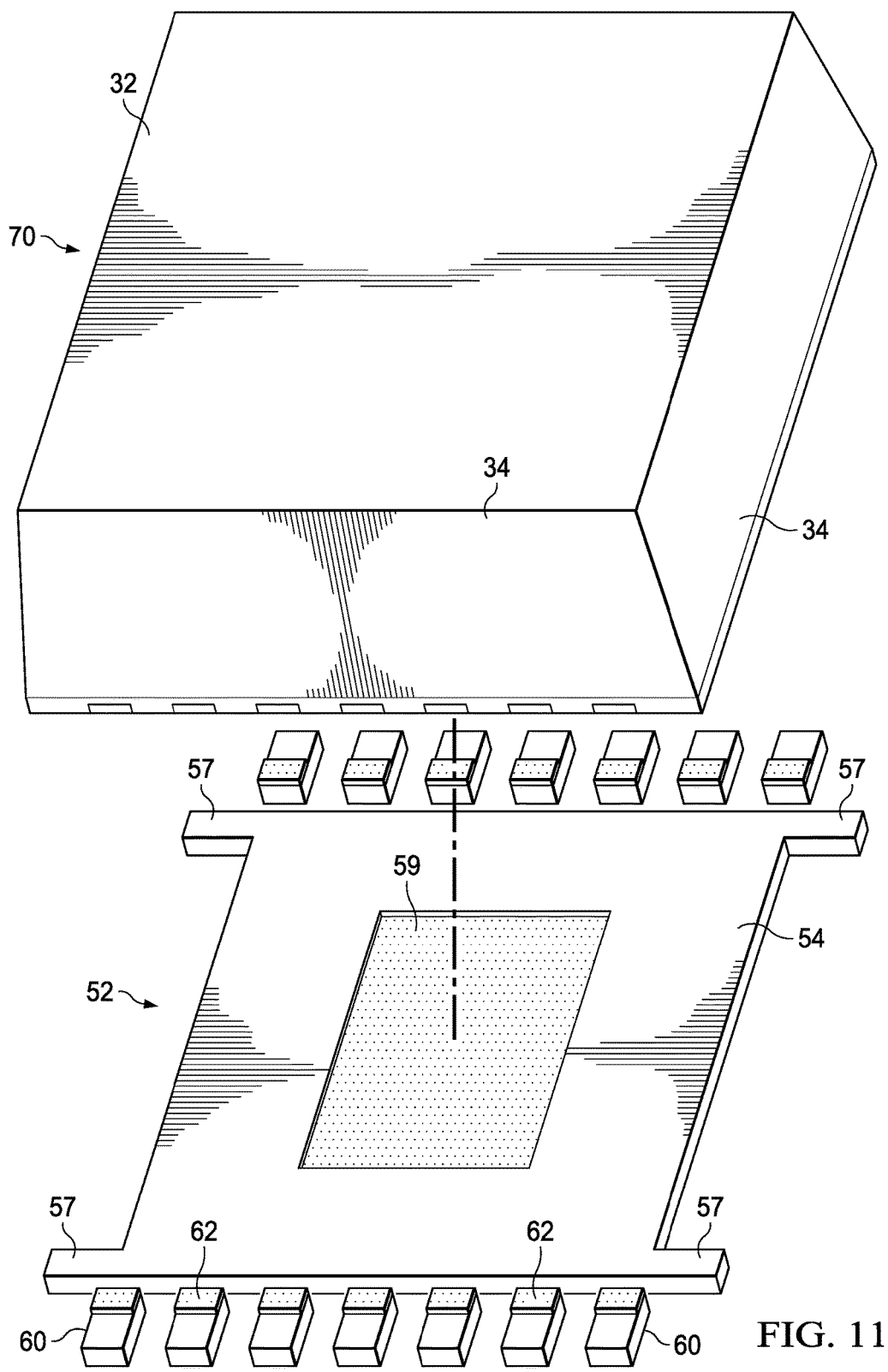
FIG. 11 is a top isometric view illustrating the mounting of the molded leadframe and attached IC die of FIG. 8 on the second leadframe of FIG. 10 to form an integrated circuit package.
Figure 12:
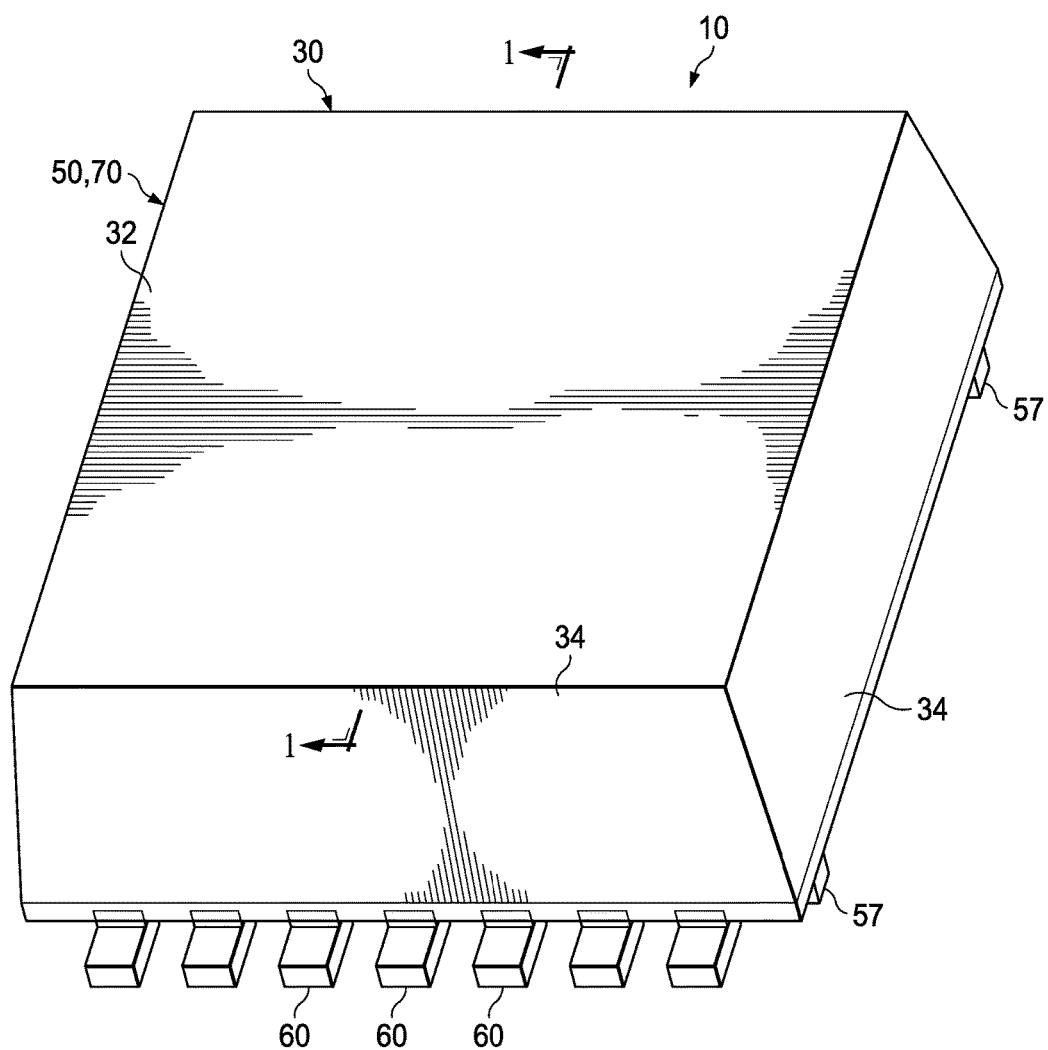
FIG. 12 is a top isometric view of the integrated circuit package formed as shown in FIG. 11.
Figure 13:
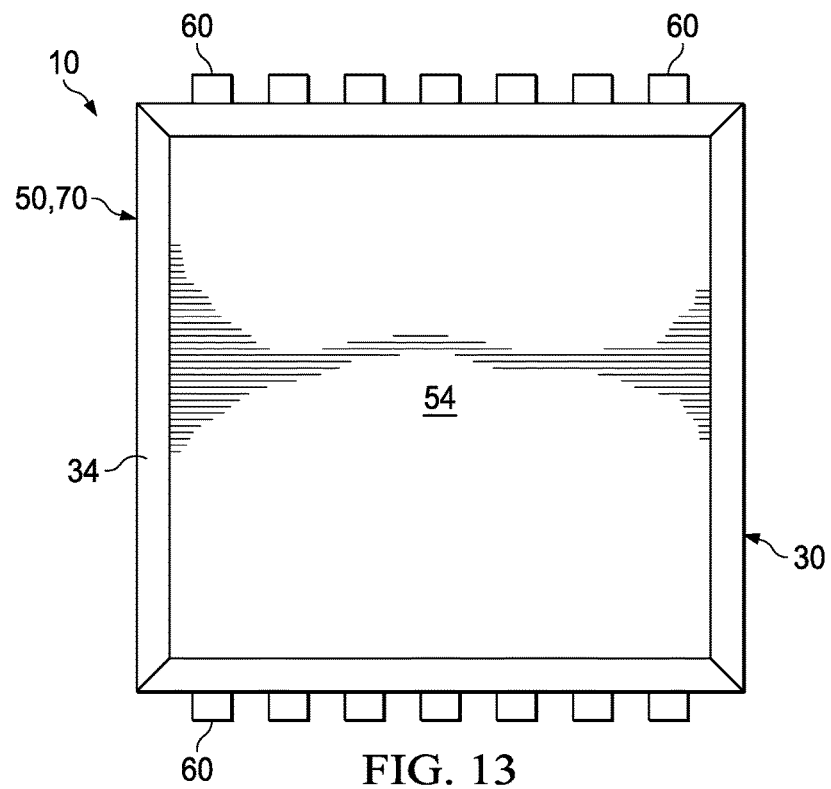
FIG. 13 is a top plan view of the integrated circuit package of FIG. 12.
Figure 15:
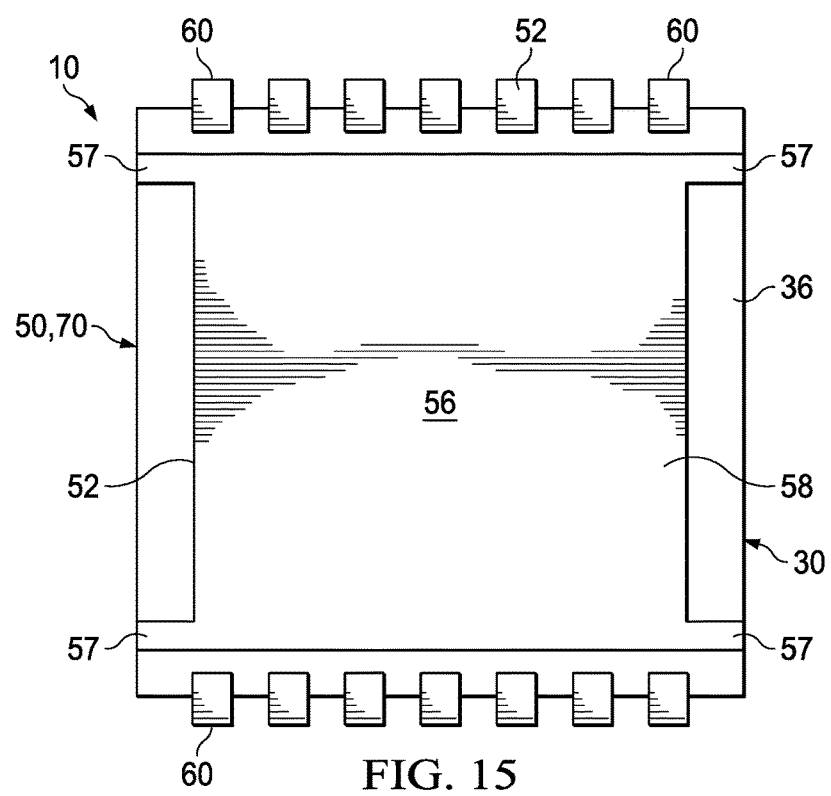
FIG. 15 is a bottom plan view of the integrated circuit package of FIGS. 12 through 14.
Figure 14:
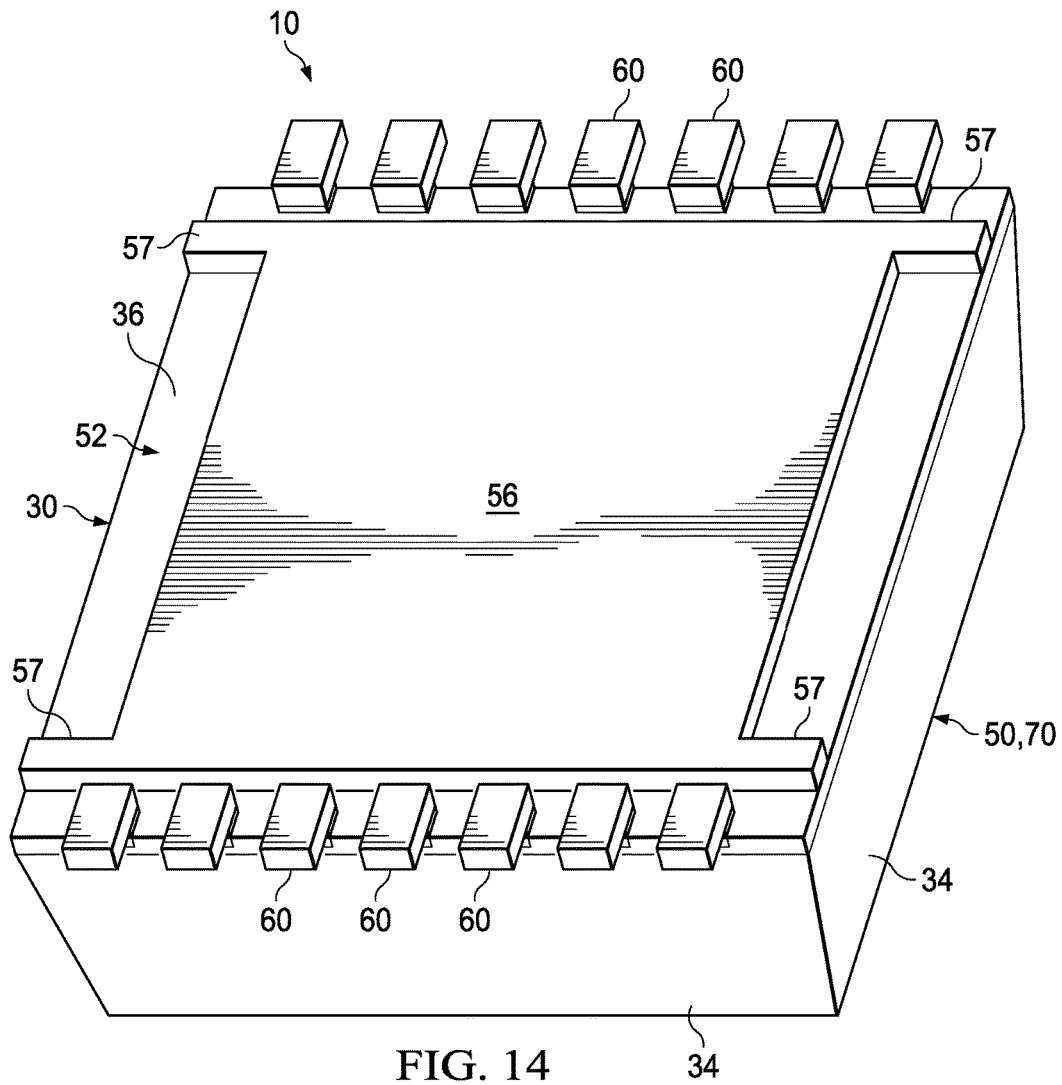
FIG. 14 is a bottom isometric view of the integrated circuit package of FIGS. 12 and 13.

Next, as shown by FIG. 11, the molded leadframe assembly 50 is placed on the second leadframe 52 with the die 64 positioned inside the recessed die attach pad 59. In this position the die back 68 is engaged with the heat sink top surface 54, as best shown in FIG. 1. The depth of the die attach pad 59 and the thickness of the die 64 are approximately the same such. This mounting of the assembly 70 of FIG. 8 onto the second leadframe 52 forms the integrated circuit package 10 shown in FIGS. 1 and 12-15.

FIGS. 12-15 are top isometric, top plan, bottom isometric, and bottom plan views, respectively, of the completed integrated circuit package 10 showing the various above discussed portions thereof.

Figure 16:
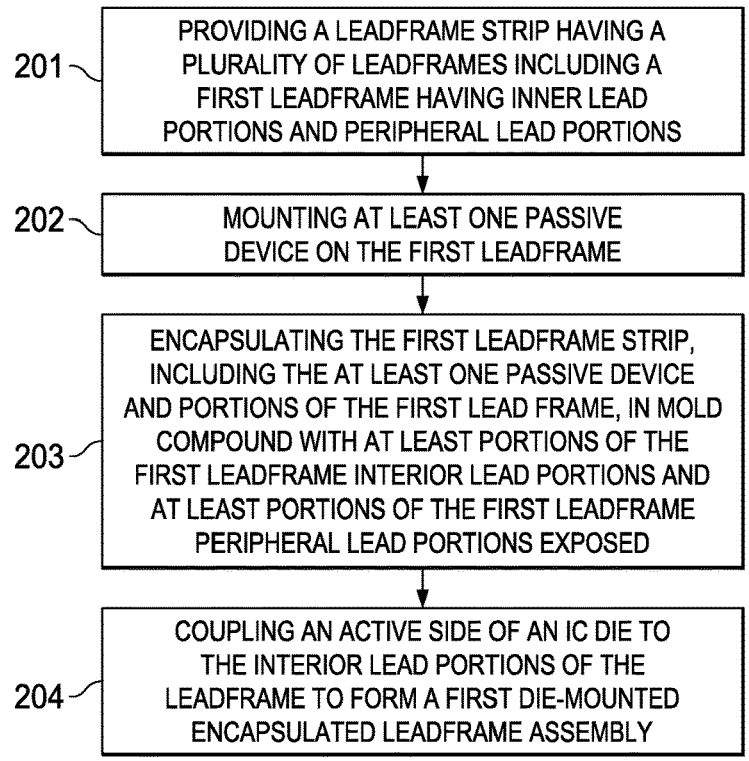
FIG. 16 is a flow diagram of a method of making an integrated circuit ("IC") package.

FIG. 16 is a flow diagram of a method of making an integrated circuit ("IC") package. The method includes, as shown at block 201, providing a leadframe strip having a plurality of leadframes including a first leadframe having inner lead portions and peripheral lead portions. The method also includes, as shown at block 202, mounting at least one passive device on the first leadframe. The method further includes, as shown at block 203, encapsulating the first leadframe strip, including the at least one passive device and portions of the first leadframe, in mold compound with at least portions of the first leadframe interior lead portions and at least portions of the first leadframe peripheral lead portions exposed. The method also includes, as shown at block 204, coupling an active side of an IC die to the interior lead portions of the first leadframe to form a first die-mounted encapsulated leadframe assembly.

Figure 17:
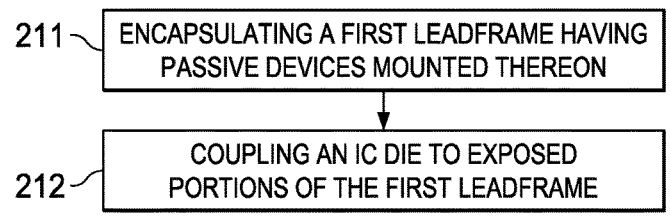
FIG. 17 is a flow diagram of a method of making an integrated circuit ("IC") package.

FIG. 17 is a flow diagram of a method of making an integrated circuit (IC) package. The method includes, as shown at block 211, encapsulating a first leadframe having passive devices mounted thereon. The method also includes, as shown at block 212, coupling an IC die to exposed portions of the first leadframe.

Figure 18:
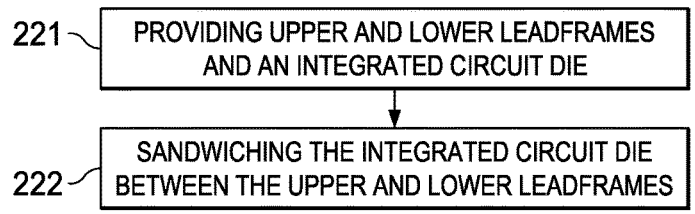
FIG. 18 is a flow diagram of a method of making and integrated circuit (IC) package.

FIG. 18 is a flow diagram of a method of making an integrated circuit (IC) package. The method includes, as shown by block 221, providing upper and lower leadframes and an integrated circuit die. The method also includes as shown by block 222, sandwiching the integrated circuit die between the upper and lower leadframes.

Certain example embodiments of an integrated circuit ("IC") package having an IC die attached to and sandwiched between top and bottom leadframes have been expressly disclosed in detail herein, as well as example embodiments of methods of making such IC packages. Various alternative embodiments of the disclosed IC package and methods will occur to those skilled in the art after reading this disclosure. It is intended for the appended claims to be broadly construed to cover all such alternative embodiments, except as limited by the prior art.

What is claimed is:

1. An integrated circuit (IC) package comprising
a first leadframe having a top surface and a bottom surface, said top surface of said first leadframe is covered by mold compound, said mold compound does not extend past said bottom surface of said first leadframe;
an IC die having an active side coupled to said first leadframe bottom surface and having a back side; and
a second leadframe having a top surface and a bottom surface, said back side of said IC die coupled to said top surface of said second leadframe.

2. The IC package of claim 1, said second leadframe comprising a heat sink, said IC die coupled to said heat sink.

3. The IC package of claim 1, said first leadframe comprising a plurality of peripheral lead portions, said second leadframe comprising a plurality of peripheral lead portions coupled to said peripheral lead portions of said first leadframe.

4. The IC package of claim 1, said first leadframe comprising a plurality of inner lead portions, said IC die active side coupled to said first leadframe inner lead portions.

5. The IC package of claim 1, said second leadframe having a recessed portion, said IC die mounted in said recessed portion.

6. The IC package of claim 1, at least one passive device mounted on said first leadframe.

7. The IC package of claim 6, said mold compound covering said at least one passive device and portions of said first leadframe.

8. The IC package of claim 3, said mold compound covering at least one passive device mounted on said first leadframe and portions of said first leadframe, said mold compound comprising a bottom surface; wherein said plurality of peripheral lead portions of said second leadframe projects laterally outwardly beyond said bottom surface of said mold compound.

9. The IC package of claim 2, said heat sink comprising a bottom surface and a top surface and having an etched recess formed therein and extending downwardly from said top surface.

10. The IC package of claim 8, said plurality of peripheral leads of said second leadframe having coplanar bottom surfaces said heat sink bottom surface being flush with said coplanar bottom surfaces.

11. The IC package of claim 8, said IC die comprising a flip chip.

12. A method of making an integrated circuit ("IC") package comprising:

providing a leadframe strip having a plurality of leadframes including a first leadframe having inner lead portions and peripheral lead portions;
mounting at least one passive device on the first leadframe;
encapsulating the first leadframe strip including the at least one passive device and portions of the first leadframe in mold compound with at least portions of the first leadframe interior lead portions and at least portions of the first leadframe peripheral lead portions exposed, the mold compound does not extend past the interior lead portions of the first leadframe; and
coupling an active side of an IC die to the interior lead portions of the first leadframe to form a first die-mounted encapsulated leadframe assembly.

13. The method of claim 12 further comprising singulating and removing the first die-mounted encapsulated leadframe assembly from at least one adjacent die-mounted encapsulated leadframe assemblies of the leadframe strip.

14. The method of claim 13 further comprising attaching a second leadframe to the first die-mounted encapsulated leadframe assembly.

15. The method of claim 14 wherein said attaching a second leadframe comprises sandwiching the IC die between the first die-mounted encapsulated leadframe assembly and the second leadframe.

16. The method of claim 15 wherein attaching a second leadframe to the first die-mounted encapsulated leadframe assembly comprises attaching a heat sink portion of the second leadframe to the back side of the IC die and attaching peripheral lead portions of the second leadframe to the peripheral lead portions of the first leadframe.

17. The method of claim 14 wherein attaching a second leadframe to the first die-mounted encapsulated leadframe assembly comprises printing conductive attachment paste on at least the peripheral lead portions of the second leadframe.

18. A method of making an integrated circuit ("IC") package comprising:
encapsulating a first leadframe and passive devices mounted thereon;
coupling an active surface of an IC die to exposed portions of the encapsulated first leadframe; and
sandwiching the IC die between the first leadframe and a second leadframe.

19. The method of claim 18 wherein said sandwiching comprises engaging a back side of the IC die with a heat sink portion of the second leadframe.

* * * * *